United States Patent
Doris et al.

(10) Patent No.: US 6,838,695 B2
(45) Date of Patent: Jan. 4, 2005

(54) CMOS DEVICE STRUCTURE WITH IMPROVED PFET GATE ELECTRODE

(75) Inventors: Bruce B. Doris, Brewster, NY (US); Ashima B. Chakravarti, Hopewell Junction, NY (US); Kevin K. Chan, Staten Island, NY (US); Daniel A. Uriarte, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 10/304,163

(22) Filed: Nov. 25, 2002

(65) Prior Publication Data

US 2004/0099860 A1 May 27, 2004

(51) Int. Cl.[7] ............................................... H01L 29/04
(52) U.S. Cl. ........................... 257/55; 257/19; 257/63; 438/48
(58) Field of Search .............................. 257/19, 55, 63; 438/48

(56) References Cited

U.S. PATENT DOCUMENTS

| | | | |
|---|---|---|---|
| 5,162,246 A | 11/1992 | Ozturk et al. | 438/297 |
| 5,241,193 A | 8/1993 | Pfiester et al. | 257/67 |
| 5,242,847 A | 9/1993 | Ozturk et al. | 438/300 |
| 5,268,324 A | 12/1993 | Aitken et al. | 438/217 |
| 5,356,821 A | 10/1994 | Naruse et al. | 438/234 |
| 5,952,701 A | 9/1999 | Bulucea et al. | 257/407 |
| 5,998,289 A | 12/1999 | Sagnes | 438/592 |
| 6,133,084 A | 10/2000 | Chang et al. | 438/238 |
| 6,180,499 B1 | 1/2001 | Yu | 438/585 |
| 6,200,866 B1 | 3/2001 | Ma et al. | 438/299 |
| 6,252,283 B1 | 6/2001 | Gardner et al. | 257/407 |
| 6,274,913 B1 * | 8/2001 | Brigham et al. | 257/368 |
| 6,281,559 B1 * | 8/2001 | Yu et al. | 257/407 |
| 6,339,232 B1 | 1/2002 | Takagi | 257/192 |
| 6,451,644 B1 * | 9/2002 | Yu | 438/230 |
| 2001/0015922 A1 | 8/2001 | Ponomarev et al. | |
| 2001/0028093 A1 | 10/2001 | Yamazaki et al. | |

OTHER PUBLICATIONS

Article entitled "Selective low–pressure chemical vapor deposition of Si1–xGex alloys in a rapid thermal processor using dichlorosilane and germane", by Zhong et al, published in Appl. Phys. Lett. 57 (20), Nov. 12, 1990, pp 2092–2094.

Article entitled "Rapid Thermal Chemical Vapor Deposition of in–situ Boron Doped Polycrystalline SixGe1–x", by Sanganeria et al., published in Journal of Electronic Materials, vol. 21, No. 1, 1992, pp. 61–64.

* cited by examiner

Primary Examiner—Nathan J. Flynn
Assistant Examiner—Scott R. Wilson
(74) Attorney, Agent, or Firm—Joseph P. Abate (57) ABSTRACT

A semiconductor device structure includes a substrate, a dielectric layer disposed on the substrate, first and second stacks disposed on the dielectric layer. The first stack includes a first silicon layer disposed on the dielectric layer, a silicon germanium layer disposed on the first silicon layer, a second silicon layer disposed on the silicon germanium layer, and a third silicon layer disposed on the second silicon layer. The second stack includes a first silicon layer disposed on the dielectric layer, and a second silicon layer disposed on the first silicon layer. Alternatively, the silicon germanium layer includes Boron.

14 Claims, 13 Drawing Sheets

CMOS DEVICE STRUCTURE WITH IMPROVED PFET GATE ELECTRODE

TECHNICAL FIELD

The present invention relates to CMOS devices and, more particularly, to high performance NFET and PFET devices formed on a same substrate.

DESCRIPTION OF THE RELATED ART

Performance gains in high performance logic circuits rely on increasing the on current without decreasing the off current. As device dimensions are scaled, performance gains are more difficult to achieve. One particular aspect of scaling involves reducing the physical thickness of the gate oxide. For a given gate voltage, an electric field is established across the gate oxide. If the gate oxide is reduced, then the magnitude of the electric field increases for the same gate voltage. In the case of a PFET device, a negative voltage is applied to the gate to turn on the device. When the device is in the on state, the channel becomes inverted with respect to its majority carrier type. As negative charges in the channel increase, the gate becomes depleted of its majority carrier. This is commonly referred to as the gate depletion effect and acts as an effective thickening of the gate oxide. This effect is particularly pronounced for thin gate oxides. Thus, gate depletion is a problem for high performance devices.

Researchers have proposed using SiGe in the gate materials to reduce the gate depletion effect. The primary benefit of using SiGe is that the solid solubility of Boron in poly SiGe is higher compared to poly Si. It has been demonstrated that the use of SiGe gate stacks improves PFET device performance. However, NFET performance is degraded with a SiGe gate stack. See, for example, U.S. Patent Application Publication 2001/0015922A1, published Aug. 23, 2001, "Semiconductor Device with an Integrated CMOS Circuit with MOS Transistors Having Silicon-Germanium ($Si_{1-x}$ $Ge_x$) Gate Electrodes, and Method of Manufacturing Same" by Marion et al., which is hereby incorporated in its entirety by reference. See also, U.S. Pat. No. 5,998,289, issued Dec. 7, 1999, "Process for Obtaining a Transistor Having a Silicon-Germanium Gate" by Sagnes, which is hereby incorporated in its entirety by reference.

The present inventors believe that further improvements in PFET and NFET device structures having SiGe in the gate materials of the PIET device are achievable.

OBJECTS OF THE INVENTION

It is a principal object of the present invention to provide a semiconductor device structure having an improved PFET device without degrading an NFET device disposed on a same substrate.

It is a further object of the present invention to provide methods for fabricating such a semiconductor device structure.

SUMMARY OF THE INVENTION

The present invention solves the problem of NFET performance degradation by using a novel integration scheme with a selective poly SiGe deposition process. The invention achieves performance improvement for CMOS devices by improving PFET performance without degrading NFET performance. The present invention is directed to a process for fabricating a PFET device with a SiGe or Ge layer while fabricating an NFET device with poly-Si only, on the same substrate. To further improve the PFET performance, the SiGe or Ge layer may be in-situ doped with Boron. The inventive scheme employs a selective growth process to achieve the final device structure. The invention also includes resulting semiconductor NFET and PFET device structures.

According to the present invention, a semiconductor device structure includes:

a substrate;

a dielectric layer disposed on the substrate;

first and second stacks disposed on the dielectric layer;

the first stack including a first silicon layer disposed on the dielectric layer, a silicon germanium layer disposed on the first silicon layer, a second silicon layer disposed on the silicon germanium layer, and a third silicon layer disposed on the second silicon layer;

the second stack including a first silicon layer disposed on the dielectric layer, and a second silicon layer disposed on the first silicon layer.

Further and still other objects of the present invention will become more readily apparent when the following detailed description is taken in conjunction with the following drawings.

DETAILED DESCRIPTION OF THE INVENTION

The best mode of the present invention will hereinafter be described, but only to an extent necessary for those skilled in the art to make, use and understand the invention. Details for conventional source/drain dopings, various impurity implantations, etc. are not discussed below at length, but will be readily understood by those skilled in the art to form fully functional PFET and NFET devices.

Referring now to the figures, a Si substrate 1 (FIG. 1) is provided.

Figure 1:
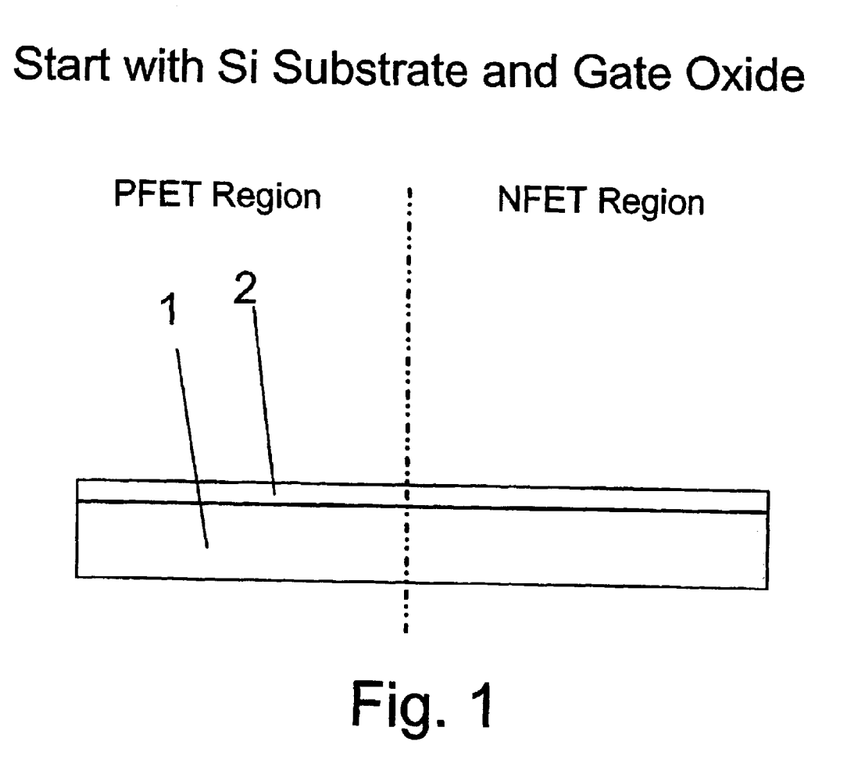
FIGS. 1–13 are side schematic views of the method steps and the resulting intermediate and final structures, according to the present invention.
Figure 2:
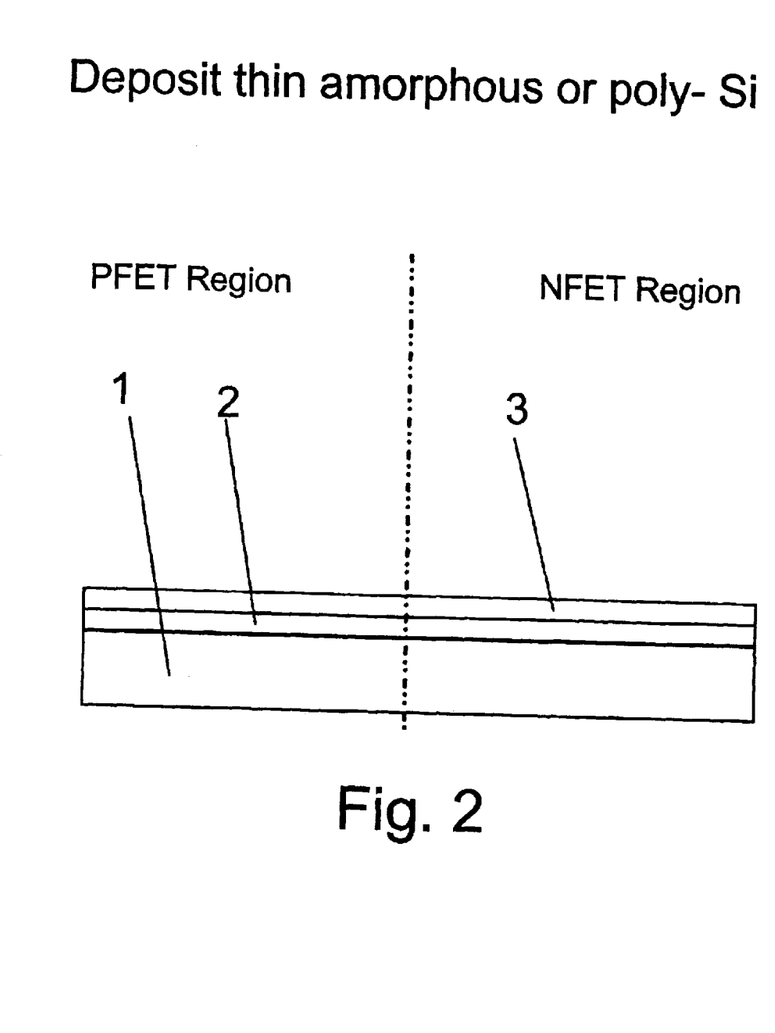

The substrate 1 is a silicon-on-insulator wafer or is a conventional bulk type Si wafer or substrate.

A conventional isolation scheme is used to pattern active regions (not shown) on the wafer and to isolate (schematically as dotted and dashed line) a proposed PFET region from a proposed NFET region. The isolation methods include, for example, shallow trench isolation (STI), or any variation of the local isolation of silicon LOCOS method, all as is well known and understood in the art.

After the isolation has been formed, any sacrificial oxidation procedure which is well known in the art may be performed, to remove any contamination or damage that may have occurred during prior processing.

The sacrificial oxide layer (not shown) can be used as a screen to prevent channeling during the well implantation (not shown), if well implantation is used to adjust the threshold voltage. In a process integration flow where well implantation is used, a conventional lithography process is used to block selected areas of the wafer with a photoresist to allow areas that are not blocked by the resist to be implanted. This step may be repeated using different masks so that devices requiring different well implants can be fabricated.

The sacrificial oxide layer is next removed by a dry or wet chemistry. For example, a dilute hydrofluoric acid mixture is used to remove the sacrificial oxide layer.

After sacrificial oxide layer removal, a gate dielectric 2 having a thickness of approximately 0.8 nm to approximately 8.0 nm is conventionally formed on the substrate 1 by, for example, thermal oxidation of the silicon substrate. As is common in the state of the art of high performance logic devices, the gate oxide 2 is typically formed so as to incorporate significant amounts of nitrogen, to reduce leakage and increase the dielectric constant of the gate dielectric material. Known process techniques capable of incorporating nitrogen include, but are not limited to, ion implantation of nitrogen atoms followed by thermal oxidation of the silicon substrate, and Plasma Nitridation of $SiO_2$. Thus, the gate dielectric is a thermal $SiO_2$, a nitrided $SiO_2$, or oxynitride. Alternatively, the gate dielectric is a high K material such as $TaO_5$, $HfO_2$, or any other gate dielectric material.

Referring now and hereafter to FIGS. 2–13, a thin layer 3 of amorphous-Si or poly-Si is next deposited over the entire wafer structure. This layer has a substantially uniform thickness (height) T in a range of about 1 nm to about 8 nm in thickness, and is deposited by any of a variety of conventional techniques such as Low Pressure Chemical Vapor Deposition (LPCVD), Plasma Enhance Chemical Vapor Deposition (PECVD), Rapid Thermal Chemical Vapor Deposition (RTCVD).

Figure 3:
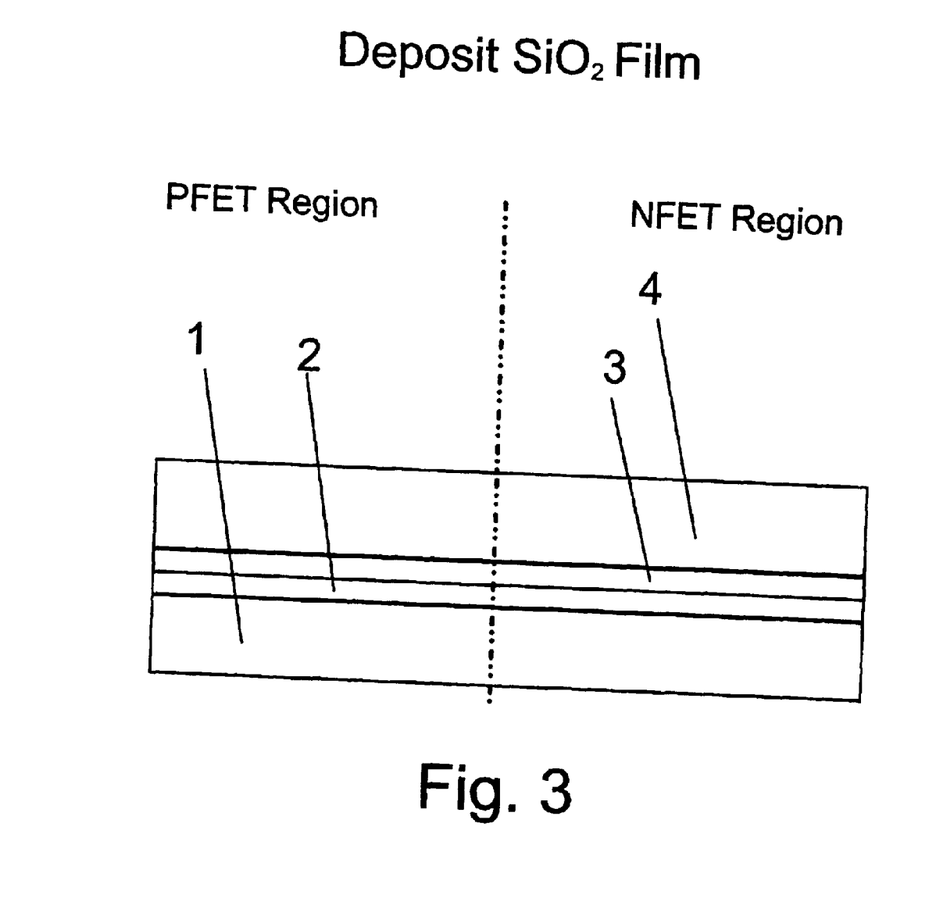

Next, a dielectric material 4 is deposited over the entire wafer structure. The dielectric 4, for example, is SiN, $SiO_2$, or SiON or the like. The dielectric film 4 has a substantially uniform thickness in a range of approximately 5 nm to approximately 70 nm in thickness and is deposited by any method known in the art. For example, the film 4 is deposited by LPCVD, PECVD, RTCVD. In one embodiment, the film 4 is Tetraethyloxysilane (TEOS) and is deposited by chemical vapor deposition.

Figure 4:
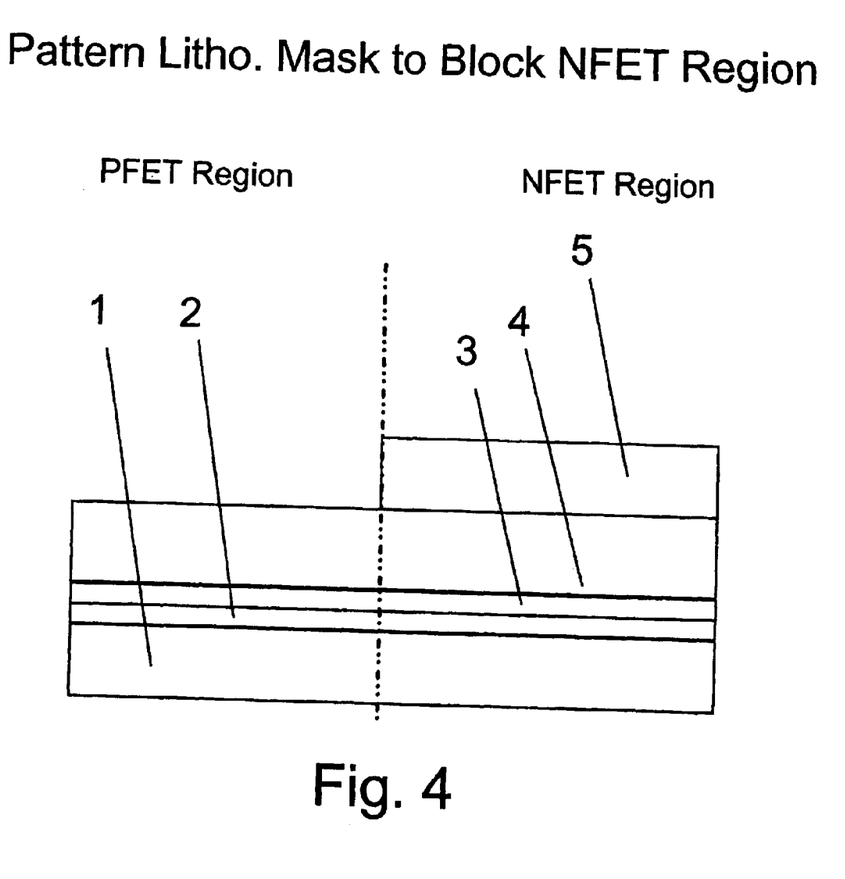
Figure 5:
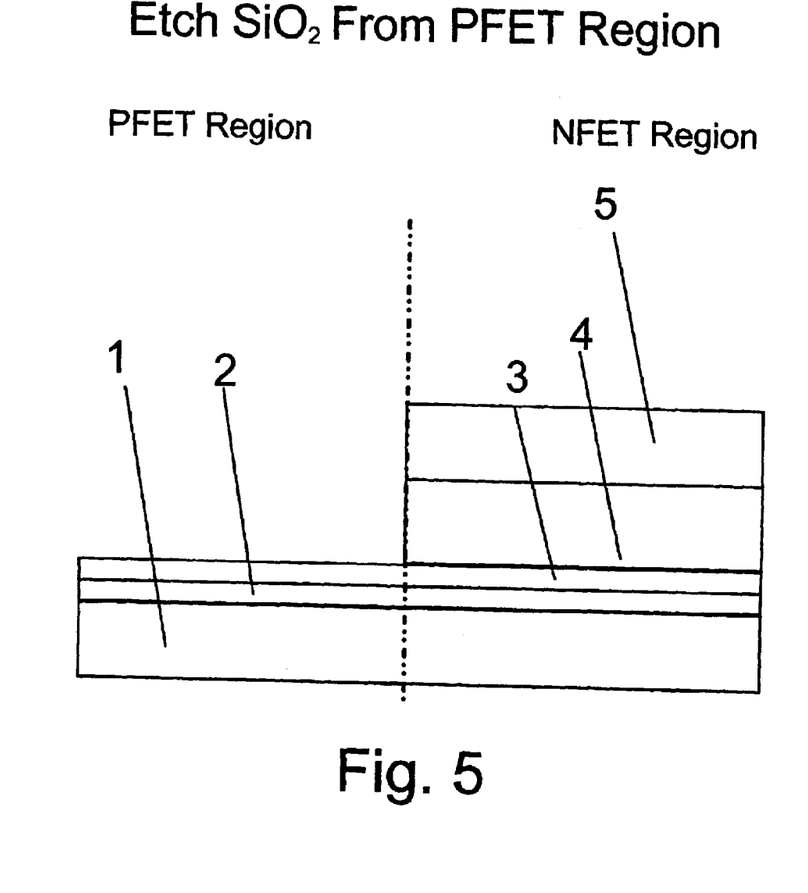
Figure 6:
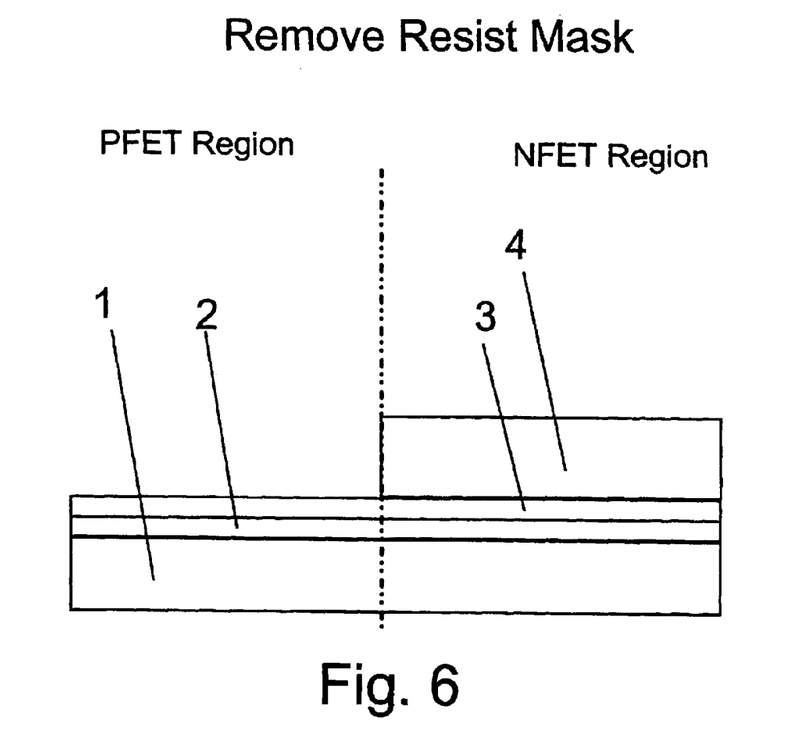
Figure 7:
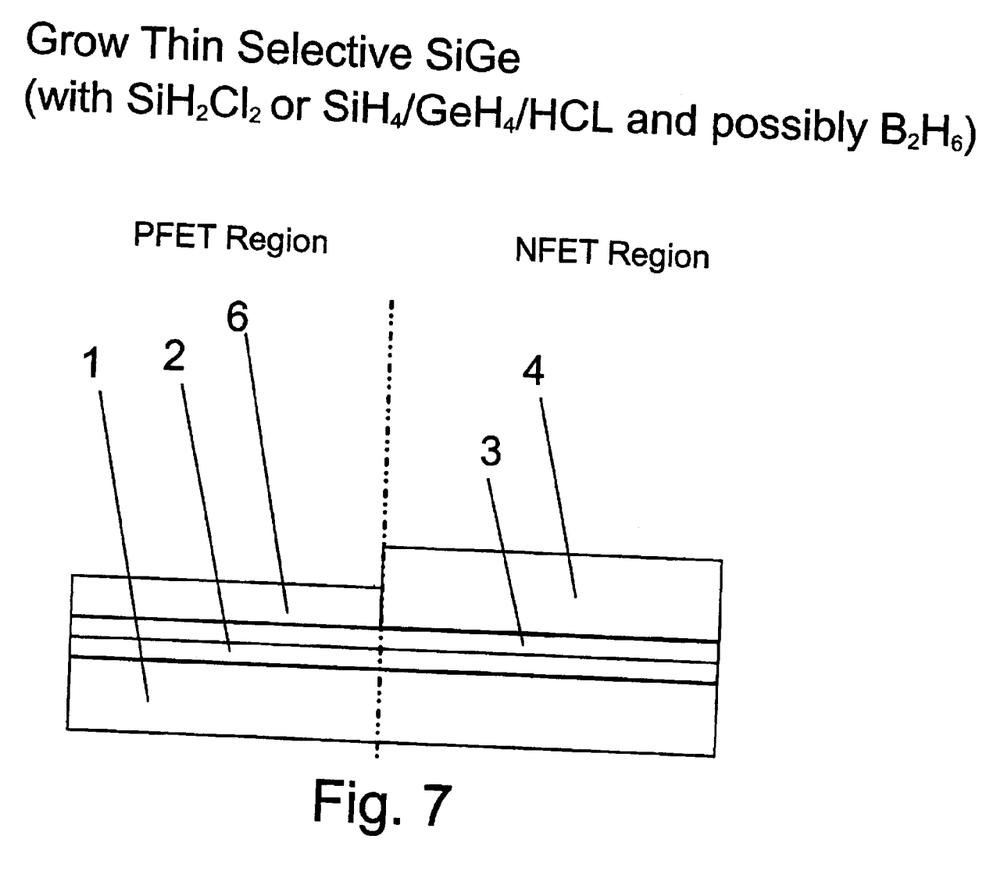
Figure 8:
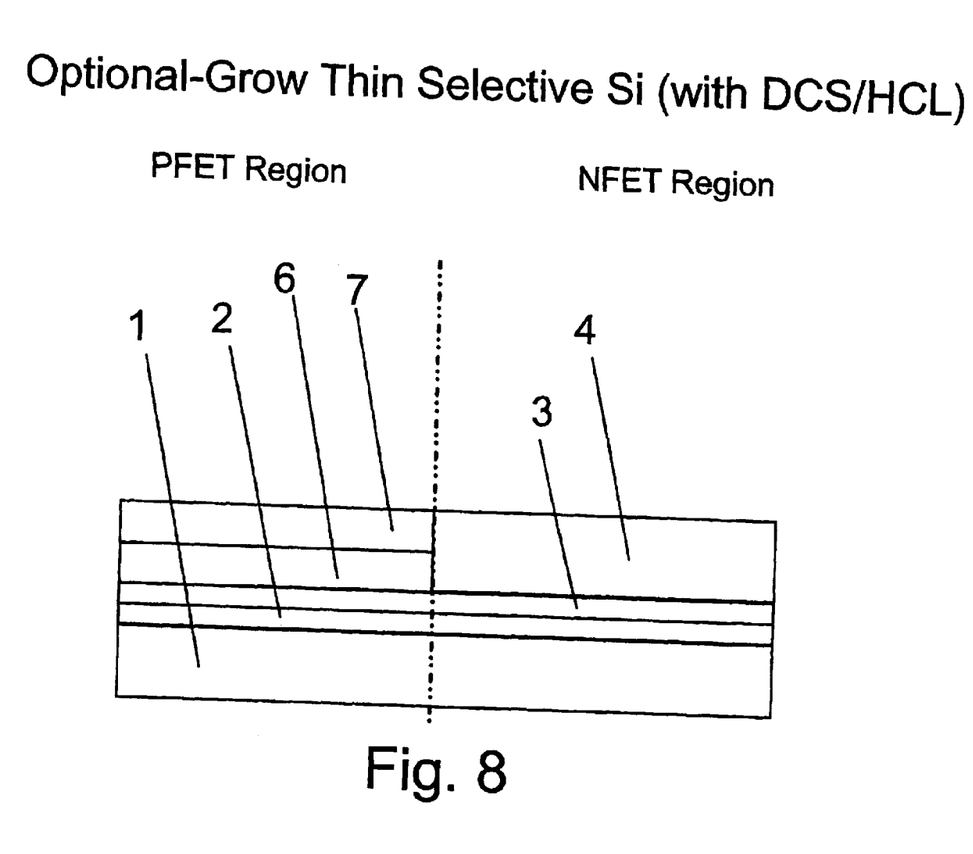
Figure 9:
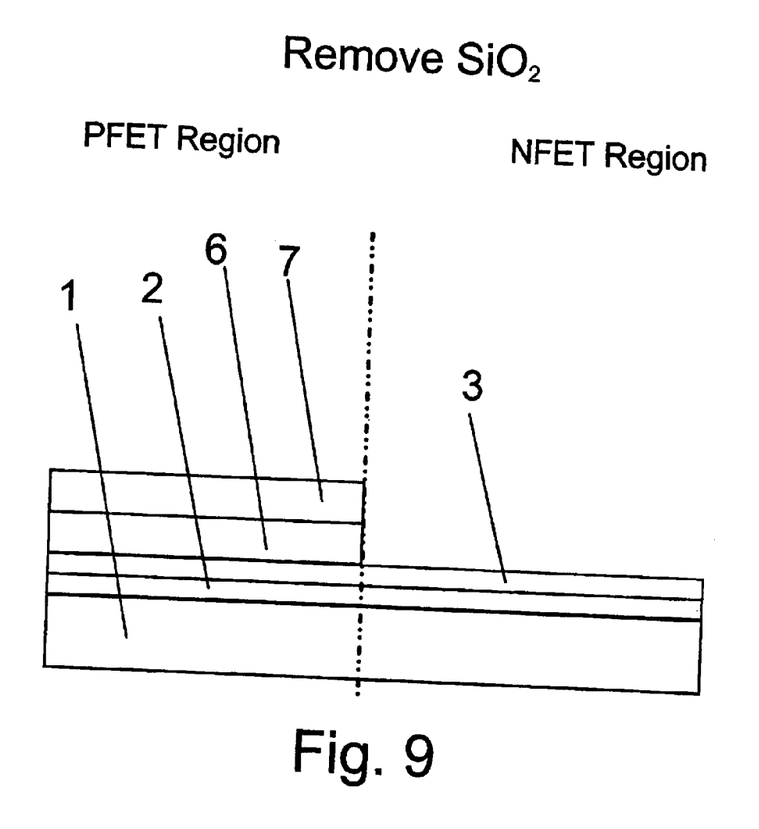
Figure 10:
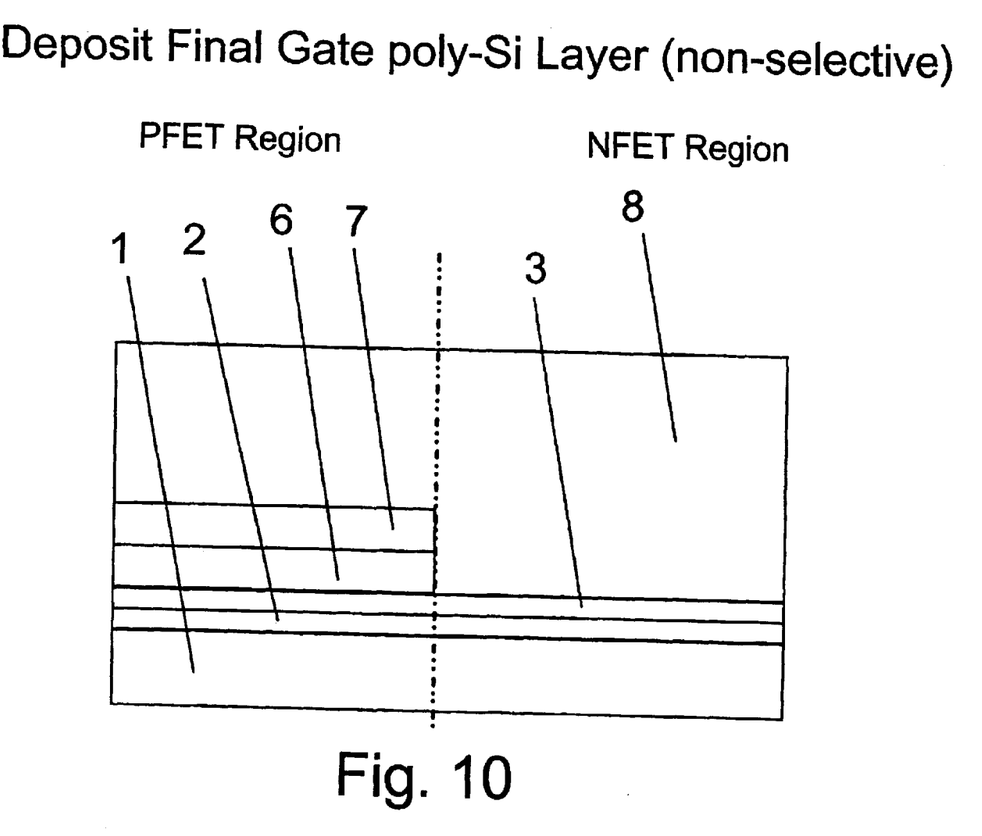

After this, a convention lithography technique is used to pattern the proposed NFET region. As seen in FIG. 4, a resist mask 5 is used to protect the dielectric film 4 from being removed from the proposed NFET region.

At this point in the inventive method (FIG. 5), a known dry or wet etch process is used to remove the dielectric film 4 from the proposed PFET region. This is possible because the NFET region is masked by the photoresist mask 5. A hydrofluoric acid solution, for example, is used to remove the dielectric film 4 if the layer 4 is $SiO_2$. A dry etch such as a $C_4F_8$ chemistry, known in the art, may also be used to etch the $SiO_2$ layer 4 selectively. If the layer 4 is a SiN dielectric film, then a wet etch including glycerol and hydrofluoric acid or a hot phosphoric acid etch is employed for the film removal step. Alternatively, dry, plasma etch including a $CHF_3$ and $CF_4$ chemistry is used to remove the SiN film 4.

After removal of the dielectric film 4, the resist mask 5 is removed by a process including a wet solvent or a dry $O_2$ plasma process known in the art. See FIG. 6.

The next step (FIG. 7) in the inventive method is a selective silicon germanium (SiGe) growth. The selective silicon germanium growth is conventional and is performed using a rapid thermal chemical vapor deposition reactor (not shown) with ultra-high vacuum capability or a low pressure chemical vapor deposition reactor. First, a pre-clean treatment in an ultra-high vacuum environment is done to remove contamination from the growth surface. This treatment may include a high temperature anneal at 850° C. for approximately three minutes. Alternatively, a wet ex-situ pre-clean is performed prior to the introduction of the wafer to the ultra-high vacuum chamber. The wet pre-clean includes, e.g., a dilute hydrofluoric acid dip to remove contamination from the growth surface. A selective silicon-germanium growth process is described in U.S. Pat. No. 5,242,847 and/or in a publication by Zhong et al. entitled "Selective Low-Pressure Chemical Vapor Deposition of $Si_{1-x}Ge_x$ Alloys in a Rapid Thermal Processor Using Dichlorosilane and Germane", in Applied Physics Letters, Vol. 57, No. 20, Nov. 12, 1990, pp. 2092–2094, the disclosures of which are both herein incorporated by reference. As described in these references, $GeH_4$ and $SiH_2Cl_2$ gas in a hydrogen carrier gas at a process pressure of 2.5 Torr, in a temperature range of 500–800° C. using $GeH_4:SiH_2Cl_2$ ratios ranging from 0.025 to 1.00 is used to deposit silicon-germanium on poly-silicon selectively with respect to $SiO_2$. Boron may be incorporated into the selective SiGe film as described in U.S. Pat. No. 5,242,847 and/or as described in a publication by Sanganeria et al. entitled "In-Situ Boron Doped Polysilicon $Si_xGe_{1-x}$ published in the Journal of Electronic Materials, Vol. 21, No. 1, pp. 61–64, 1994, which are both incorporated herein by reference. As described in these references, $GeH_4$ and $B_2H_6$ may be premixed with hydrogen to a dilution 7.8% and 40 ppm, respectively, and $SiH_2Cl_2$ gas with a flow in the range of 10–12.5 sccm with the $GeH_4$ flow at 5 sccm to generate a film with 30% germanium concentration and a boron concentration of $10^{20}–10^{21}$ boron atoms per cubic centimeter. The thickness of the film 6 is substantially uniform and in a range of about 0.2 to about 50 nm.

An optional step in the inventive method may be used to selectively grow an intrinsic silicon layer 7 on top of the selective SiGe layer 6. The layer 7 is grown, for example, by using the same process conditions as described above for the case that x in the $Si_{1-x}Ge_x$ is close to zero. HCl gas may also be introduced into the CVD reactor to improve the selectivity of the silicon growth with respect to the dielectric film covering the NFET region. A preferred ratio of the gas mixture $SiH_2Cl_2:HCl$ is 3.5:1 to 4.75:1 to achieve good selectivity. See FIG. 8. The thickness of the layer 7 is substantially uniform and is in a range of about 0.2 to about 50 nm.

Next, the dielectric film 4, is removed from the proposed NFET region. For example, a hydrofluoric acid solution is used to remove the dielectric film 4 if the layer 4 is $SiO_2$. A dry etch comprised of a $C_4F_8$ chemistry, known in the art, may also be used to etch the $SiO_2$ layer selectively. If the layer 4 is a SiN dielectric film, then a wet etch including glycerol and hydrofluoric acid or a hot phosphoric acid etch may be employed for the film 4 removal process. Alternatively, dry, plasma etch including $CHF_3$ and $CF_4$ chemistry may be used to remove the SiN film 4. See FIG. 9.

At this stage in the inventive process, a conventional technique is used to deposit an amorphous-silicon or poly-silicon film 8 with a substantially uniform thickness in the range of 20 nm to 200 nm over the entire wafer structure. The film 8 is deposited by Low Pressure CVD, RTCVD, PECVD or any other suitable deposition technique. In some instances, a dry in-situ clean or wet ex-situ clean may be used prior to the deposition of film 8. See FIG. 10.

Because some undesired topography (not shown) may exist depending on the choice of film thickness for layer 3 and the layer 6, a chemical mechanical polishing (CMP) process may be used to eliminate the topography prior to a lithography step next employed.

Figure 11:
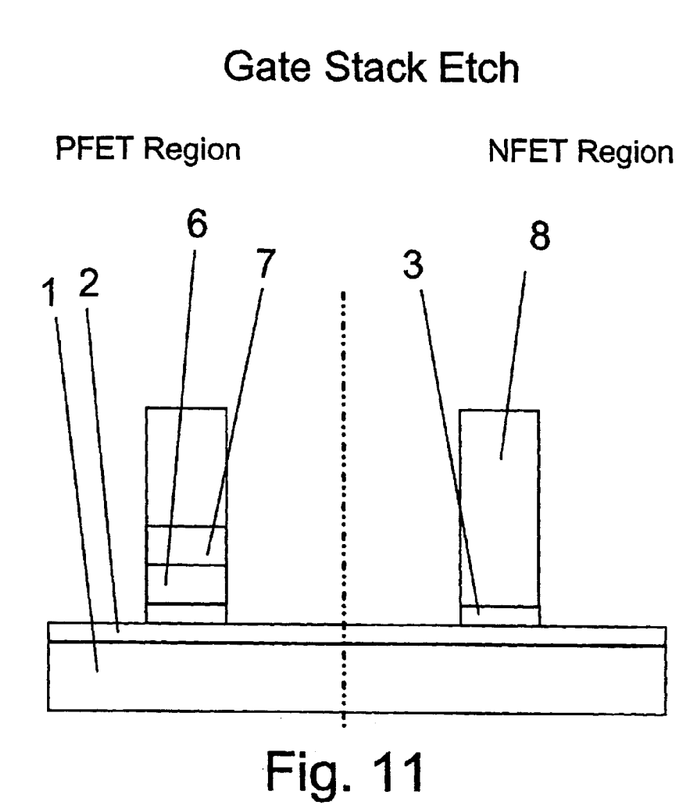
Figure 12:
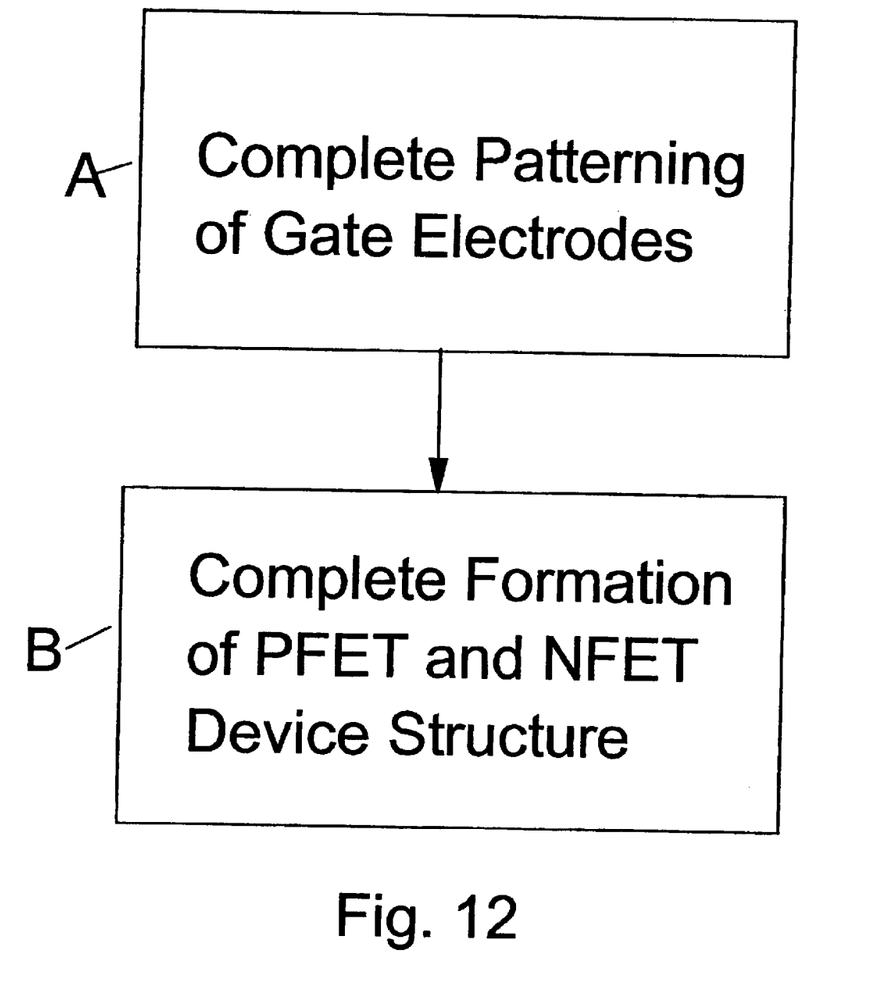

A conventional series (Block A of FIG. 12) of process steps is now used to complete the gate electrode patterning to result in a semiconductor device structure as shown in FIG. 11. First a low temperature SiO$_2$ (not shown) is deposited to be used as a hard mask, The film may be deposited using a Chemical Vapor Deposition technique. Next, a deep ultra-violet lithography process, well known in the art, is performed on the structure by first applying an anti-reflective coating, and then applying a photosensitive resist material. After this, the resist is exposed using a mask, after which the resist images are developed. The resist images are then used selectively to block regions from the gate stack etch. The anti-reflective coating and hard mask may be etched using a non-selective plasma etch with a high wafer bias condition. After the anti-reflective coating and hard mask etch, the resist and anti-reflective coating are removed by an O$_2$ ashing process or solvent strip. Next, the hard mask (not shown) is used to define the gate electrode. A dry plasma etch with hydrogen bromine may be used to etch the poly-Si and poly-SiGe regions selective to the hard mask. The hard mask is removed by wet etching using a hydrofluoric acid chemistry. At this point in the process flow, the gate electrodes 3,6,7,8 for the proposed PFET region, 3,8 for the proposed NFET region, appear as shown schematically in FIG. 11. Preferred substantially uniform thicknesses for the layers 3,6,7 of the PFET are approximately (±10): 2 nm, 5 nm and 7 nm, while preferred substantially uniform thicknesses for the layers 3,8 of the NFET are approximately 2 nm and 8 nm.

Figure 13:
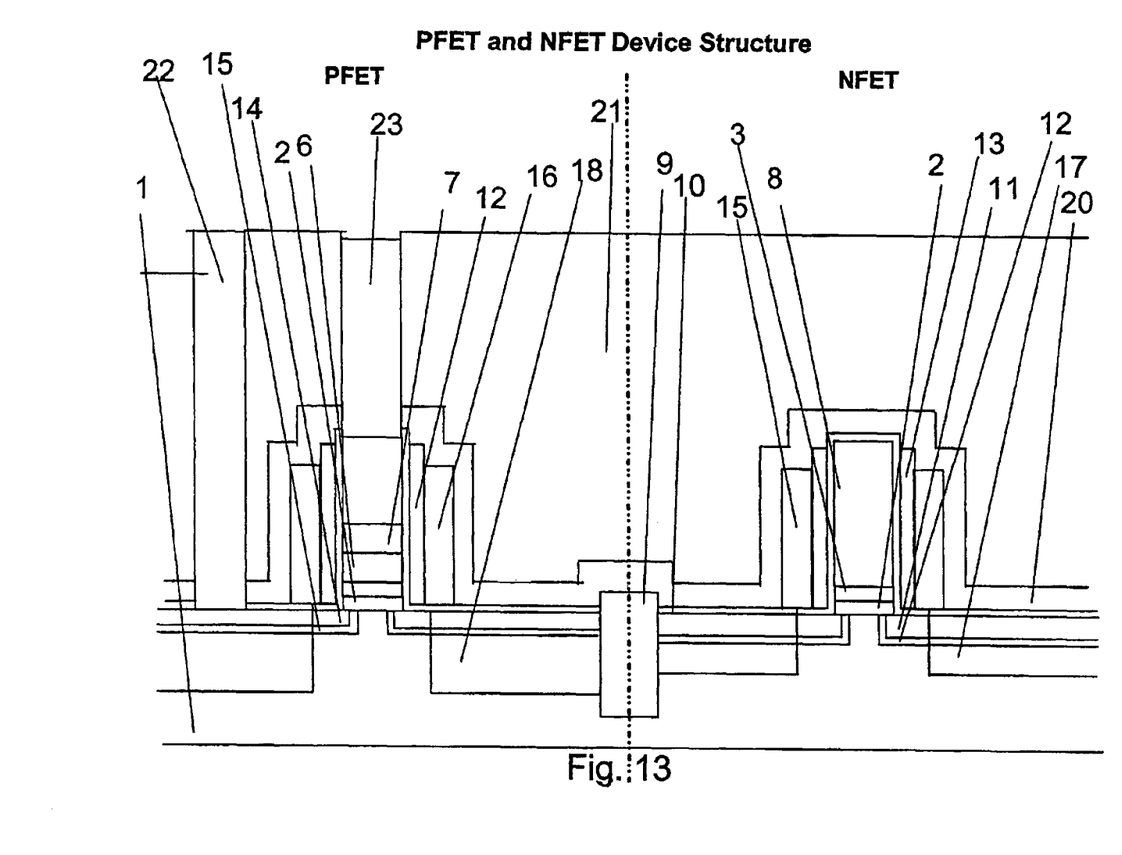

Final conventional processing steps are now performed to complete a device structure (FIG. 13) including a PFET device and an NFET device, such as: gate reoxidation 10, NFET extension 11 and halo implantation 12, spacer formation 13, PFET extension 14 and halo implantation 15, source-drain spacer formation 16, NFET source-drain implantations 17, PFET source-drain implantations 18, activation anneal, silicide 19, barrier nitride deposition 20, pre-metal dielectric deposition 21, lithography for source-drain 22 and gate contacts 23, contact etch, liner and metal deposition followed by CMP and conventional back end of the line (BEOL) processing including low K materials application and etching, as well as deposition of state of the art liner and metal wiring materials such as Cu, for example. The implants and extensions mentioned above are provided conventionally into the substrate 1. Isolation 9 is also shown in FIG. 13.

While there has been shown and described what is at present considered a preferred embodiment of the present invention, it will be readily understood by those skilled in the art that various changes and modification may be made therein without departing from the spirit and scope of the present invention which shall be limited only by the scope of the claims.

What is claimed is:

1. A semiconductor device structure, comprising:
    a substrate;
    a dielectric layer disposed on the substrate;
    first and second stacks disposed on the dielectric layer;
    the first stack including a first silicon layer disposed on the dielectric layer, a silicon germanium layer disposed on the first silicon layer, a second silicon layer disposed on the silicon germanium layer, and a third silicon layer disposed on the second silicon layer;
    the second stack including a first silicon layer disposed on the dielectric layer, and a second silicon layer disposed on the first silicon layer.

2. The structure as claimed in claim 1, wherein the first silicon layer of the first stack includes polysilicon, and the first silicon layer of the second stack includes polysilicon.

3. The structure as claimed in claim 1, wherein the first silicon layer of the first stack includes amorphous silicon, and the first silicon layer of the second stack includes amorphous silicon.

4. The structure as claimed in claim 1, wherein the substrate is a silicon-on-insulator substrate.

5. The structure as claimed in claim 1, wherein the silicon germanium layer has a germanium concentration in a range of about 0.1% to about 100%.

6. The structure as claimed in claim 1, wherein the silicon germanium layer includes Boron.

7. The structure as claimed in claim 1, wherein the silicon germanium layer has a substantially uniform thickness of approximately 5 nm.

8. A semiconductor device structure, comprising:
    an NFET device and a PFET device disposed on a substrate, the PFET device including a first gate stack, the NFET device including a second gate stack, wherein the first gate stack includes a silicon germanium layer and the second gate stack consists essentially of silicon and dielectric layers.

9. The structure as claimed in claim 8, wherein the silicon germanium layer includes Boron.

10. The structure as claimed in claim 8, wherein the first gate stack consists essentially of silicon and silicon germanium layer, and wherein the second gate stack consists essentially of silicon layers.

11. The structure as claimed in claim 10, wherein the silicon germanium layer includes Boron.

12. A method of fabricating a semiconductor device, comprising:
    providing a first substrate;
    providing a first dielectric layer onto the substrate;
    providing a first polysilicon layer onto the first dielectric layer;
    providing a second dielectric layer onto the first polysilicon layer;
    providing a mask over one region of the second dielectric layer;
    removing another region of the second dielectric layer;
    removing the mask;
    providing a silicon germanium layer on a first region of the first polysilicon layer;
    providing a silicon layer on the silicon germanium layer;
    removing the second dielectric layer;
    providing a second polysilicon layer onto the silicon layer and onto the first polysilicon layer, and then patterning the resulting structure to form a first stack adjacent to a second stack on the first dielectric layer, only the first stack including a portion of the silicon germanium layer.

13. The method as claimed in claim 12, wherein said step of providing a silicon germanium layer includes selectively growing the silicon germanium layer.

14. The method as claimed in claim 12, wherein said step of providing a silicon germanium layer includes selectively growing the silicon germanium layer and incorporating Boron into the silicon germanium layer.

* * * * *